(12) United States Patent
Kim

(10) Patent No.: US 6,440,794 B1
(45) Date of Patent: Aug. 27, 2002

(54) METHOD FOR FORMING AN ARRAY OF DRAM CELLS BY EMPLOYING A SELF-ALIGNED ADJACENT NODE ISOLATION TECHNIQUE

(75) Inventor: Byeong Kim, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/321,922

(22) Filed: May 28, 1999

(51) Int. Cl.[7] .......................................... H01C 21/8242
(52) U.S. Cl. ...................... 438/248; 438/243; 438/244; 438/386; 438/387; 438/371
(58) Field of Search ................................ 438/243, 244, 438/245, 246, 247, 248, 249, 386, 387, 389, 390, 391, 392

(56) References Cited

U.S. PATENT DOCUMENTS

| | | | |
|---|---|---|---|
| 4,577,395 A | 3/1986 | Shibata | 438/386 |
| 4,833,516 A | 5/1989 | Hwang et al. | 257/302 |
| 4,920,065 A | 4/1990 | Chin et al. | 248/243 |
| 5,006,910 A | 4/1991 | Taguchi | 257/305 |
| 5,065,273 A * | 11/1991 | Rajeevakumar | 361/313 |
| 5,360,758 A | 11/1994 | Bronner et al. | 438/243 |
| 5,389,559 A | 2/1995 | Hsieh et al. | 438/243 |
| 5,395,786 A | 3/1995 | Hsu et al. | 438/248 |
| 5,670,805 A | 9/1997 | Hammerl et al. | 257/301 |
| 5,696,019 A | 12/1997 | Chang | 438/221 |
| 5,780,332 A | 7/1998 | Ozaki | 438/238 |
| 6,235,575 B1 * | 5/2001 | Kasai et al. | 257/300 |
| 6,236,079 B1 * | 5/2001 | Nitayama et al. | 257/304 |
| 6,287,914 B1 * | 9/2001 | Uchiyama et al. | 438/243 |
| 6,326,262 B1 * | 12/2001 | Temmler et al. | 438/222 |
| 6,368,911 B2 * | 4/2002 | Fu | 257/314 |
| 6,399,447 B1 * | 6/2002 | Clevenger et al. | 438/238 |
| 2001/0050388 A1 * | 12/2001 | Hamamoto | 257/301 |

* cited by examiner

*Primary Examiner*—John F. Niebling
*Assistant Examiner*—Jennifer M. Kennedy
(74) *Attorney, Agent, or Firm*—Daryl K. Neff; Todd M. C. Li

(57) ABSTRACT

In a method for forming an array of dynamic random access memory (DRAM) cells, each DRAM cell having one or more field effect transistors (FETs) and a deep trench capacitor, first, a substrate is prepared. Line type active areas (AAs) are patterned on the substrate to thereby provide AA lines (AALs). Next, deep trench capacitors (DTCs) are fabricated in an AAL in a predetermined configuration to thereby define deep trench areas (DTAs) for the DTCs, each DTC having a storage node, a collar insulator and a buried strap. In subsequent step, a node isolation area (NIA) is defined to isolate a storage node of a DTC and a storage node of its adjacent DTC and then a trench isolation area (TIA) for each of the DRAM cell is defined. Further, one or more FETs are fabricated in each AA to thereby form the array of DRAM cells, wherein a conductive path is formed from an electrode of one of the FETs to the buried strap of a corresponding DTC. In accordance with the present invention, since the AAs can be formed before DTCs are formed, the so-called thermal budget problem can be solved or relaxed; the AAs can be patterned with a great ease since the AAs are patterned as a line type; and the overlay margin between each AA and a corresponding DTA in a DRAM cell can be improved by employing a maskless self-aligned adjacent node isolation technique.

14 Claims, 12 Drawing Sheets

METHOD FOR FORMING AN ARRAY OF DRAM CELLS BY EMPLOYING A SELF-ALIGNED ADJACENT NODE ISOLATION TECHNIQUE

FIELD OF THE INVENTION

The present invention relates to a method for forming an array of dynamic random access memory (DRAM) cells; and, more particularly, to a method for forming an array of DRAM cells by employing a self-aligned adjacent node isolation technique.

DESCRIPTION OF THE PRIOR ART

Referring to FIG. 1, there is shown a schematic diagram of a typical dynamic random access memory (DRAM) cell 100 having a field effect transistor (FET) 105 as an access transistor or as a transfer transistor for controlling charge transfer and a storage capacitor $C_s$ for storing charges. The gate of the FET 105 acts as an word line W/L. A bitline B/L is connected to one terminal of the FET 105, the terminal acting as the source or drain of the DRAM cell 100, depending on the application, such as read or write operations.

The other terminal of the FET 105 is connected to a first electrode 110 as a strap or storage node of the storage capacitor $C_s$. A second electrode 115 as a capacitor plate of the storage capacitor $C_s$, wherein the second electrode 115 is connected to a predetermined potential such as ground potential. When the FET 105 is turned on by an appropriate signal on the wordline W/L, data is transferred between the bitline B/L and the storage node 110.

High integration density of DRAM cells requires reduction of the area of each of the DRAM cells. While it is desirable to increase the integration density of DRAM cells by rendering an access transistor and a storage capacitor in a DRAM cell smaller, a capacitor therein nonetheless must be large enough to store sufficient charges for ensuring that data is correctly read from and written to the DRAM cell. In this respect, the so-called deep trench capacitors (DTCs) have been developed to increase the capacitance of the storage capacitor while permitting the integration density of the DRAM cell to be increased.

Various techniques have been employed for connecting a DTC to an access transistor in a DRAM cell. For example, a self-aligned buried strap formation technique is known in the art as described in U.S. Pat. No. 5,670,805 issued to Hammerl et al. and U.S. Pat. No. 5,360,758 issued to Bronner et al.

FIG. 2 offers a top plan view illustrating a layout of a conventional array of DRAM cells. FIG. 3 is a cross-sectional view of a DRAM cell 210 taken along a line H–H' of FIG. 2. Referring to FIGS. 2 and 3, it could be readily understood that the DRAM cell 210 comprises two deep trench areas (DTAs) DTA1 and DTA2 and one active area (AA). As is well-known in the art, an AA and a DTA represent areas that one or more access transistors and one DTC are to be formed therein, respectively.

In a conventional DRAM cell layout, a DRAM cell is separated from each other by the so-called a field region (FR) or field oxide region (FOR) as shown in FIG. 2. The FR represents an area separating adjacent AAs from each other and/or adjacent DTAs from each other with a relatively thick field oxide that surrounds and electrically isolates each AA and each DTA in and on a substrate.

One of conventional methods for forming FR is the so-called shallow trench isolation (STI) in which trenches are etched in the substrate and filled with a chemical vapor deposited (CVD) oxide that is made planar with the substrate. Referring to FIG. 2, it could be understood that the conventional array of DRAM cells formed by employing such a STI technique includes the so-called island type AAs.

Referring back to FIG. 3, the DRAM cell 210 comprises two DTCs DTC1 and DTC2 formed in deep trenches (DTs) DT1 and DT2, respectively; and two field effect transistors (FETs) FET1 and FET2 formed in a substrate 305 doped with p-type material, e.g., having a p-well 310 formed therein. The DTC1 includes a capacitor plate 315, a collar oxide 375, a storage node 371 and a buried strap 373. The DTC2 includes a capacitor plate 395, a collar oxide 385, a storage node 381, and a buried strap 383.

The FET1 includes $N^+$ source/drain regions 333 and 335, a poly-silicon gate 325 insulatively spaced from the channel between $N^+$ source/drain regions 333 and 335. The FET2 includes $N^+$ source/drain regions 343 and 335, a poly-silicon gate 355 insulatively spaced from the channel between $N^+$ source/drain regions 343 and 335.

Gate contacts 370 and 360 electrically connect the poly-silicon gates 325 and 355 to a word line (not shown), respectively. An insulator 380 covers the gate contact 370 and the poly-silicon gate 325; and an insulator 365 covers the gate contact 360 and the poly-silicon gate 355. A bit line contact 386 electrically connects the $N^+$ source/drain region 335, which is a common source/drain region for both the FET1 and the FET2, to a bit line 390.

A diffusion region 374 is formed as a conductive path to electrically connect the storage node 371 to the $N^+$ source/drain region 333 through the buried strap 373 by outdiffusing dopants from the highly doped poly-silicon fill in the DT1 into the p-well 310. A diffusion region 384 is also formed as a conductive path to electrically connect the storage node 381 to the $N^+$ source/drain region 343 through the buried strap 383 by outdiffusing dopants from the highly doped poly-silicon fill in the DT2 into the p-well 310.

Shallow trench isolation (STI) arrangements 350 and 450, filled with an insulating material, e.g., oxide, isolate the DRAM cell 210 from its adjacent DRAM cells; and isolate the DRAM cell 210 from passing poly-silicon gates 351 and 451.

It should be noted that the conventional array of DRAM cells results in the so-called island type layout as illustrated in FIG. 2 since adjacent storage nodes are isolated during AA formation or STI. In this DRAM cell layout, the overlay between an AA and a corresponding DTA becomes very critical to the device performance, rendering the DRAM cell fabrication process difficult.

Moreover, in the conventional array of DRAM cells, DTCs are fabricated before AA formation to meet the overlay requirements, which, in turn, limits the so-called thermal budget during the STI process. Exceeding this thermal budget leads to an excessive outdiffiision from the trench poly-silicon fill constituting the storage node to underneath the gate and neighboring DRAM cells (374 and 384). This dopant outdiffusion may result in unacceptable changes of the characteristics of the access transistor as well as electrical leakage between neighboring DRAM cells.

In addition, as is well-known in the art, the limitation on the thermal budget after buried strap formation limits the following oxidation steps and conflicts with the need for thermal anneals to heal implantation damage or to relieve stress built up in the substrate, e.g., a silicon substrate, during the DRAM cell fabrication process.

Conventional techniques such as those described in the above-mentioned U.S. Pat. Nos. 5,670,805 and 5,360,758 have been suggested to relieve the thermal budget problem. But none the conventional techniques including these techniques are sufficient enough to solve the thermal budget problem since they have the basic limitation that DTCs are fabricated before AA patterning.

Further, the lithography of the island type pattern of the conventional array of DRAM cell can be problematic or difficult, especially on a non-uniform topological region, e.g., on top of a DT.

SUMMARY OF THE INVENTION

It is, therefore, an object of the present invention is to provide a method for forming an array of DRAM cells by patterning line type active areas (AAs), thereby rendering patterning of the AAs easier.

Another object of the present invention is to provide a method for forming an array of DRAM cells by employing a maskless self-aligned adjacent node isolation technique to thereby eliminate the issue of the overlay or improve the overlay margin between an AA and a corresponding DTA in a DRAM cell.

A further object of the present invention is to provide a method for forming an array of DRAM cells by forming line type AAs before DTCs are formed to thereby solve the thermal budget problem.

In order to achieve the above-mentioned objects of the present invention, there is provided a method for forming an array of dynamic random access memory (DRAM) cells, comprising the steps of: (a) patterning line type active areas (AAs) on a substrate to thereby provide AA lines (AALs); (b) fabricating deep trench capacitors (DTCs) in each of the AALs in a predetermined configuration, thereby defining deep trench areas (DTAs) for the DTCs; and (c) defining a node isolation area (NIA) to isolate storage nodes of two adjacent DTCs and then defining a trench insulation area (TIA) for each of the DRAM cells. The order of (a) and (b) can be interchanged as it will be described in detail to have an advantage of thermal budget.

BRIEF DESCRIPTION OF THE DRAWINGS

The above and other objects and features of the present invention will become apparent from the following description of preferred embodiments given in conjunction with the accompanying drawings, in which.

DETAILED DESCRIPTION OF THE PREFERRED EMBODIMENTS

Figure 1:
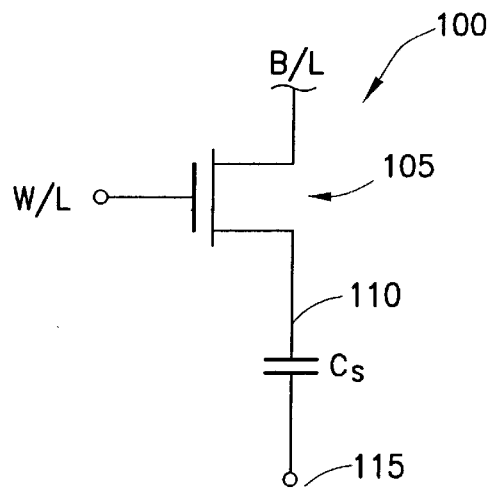
FIG. 1 shows a schematic diagram of a typical DRAM cell having a field effect transistor and a storage capacitor.
Figure 2:
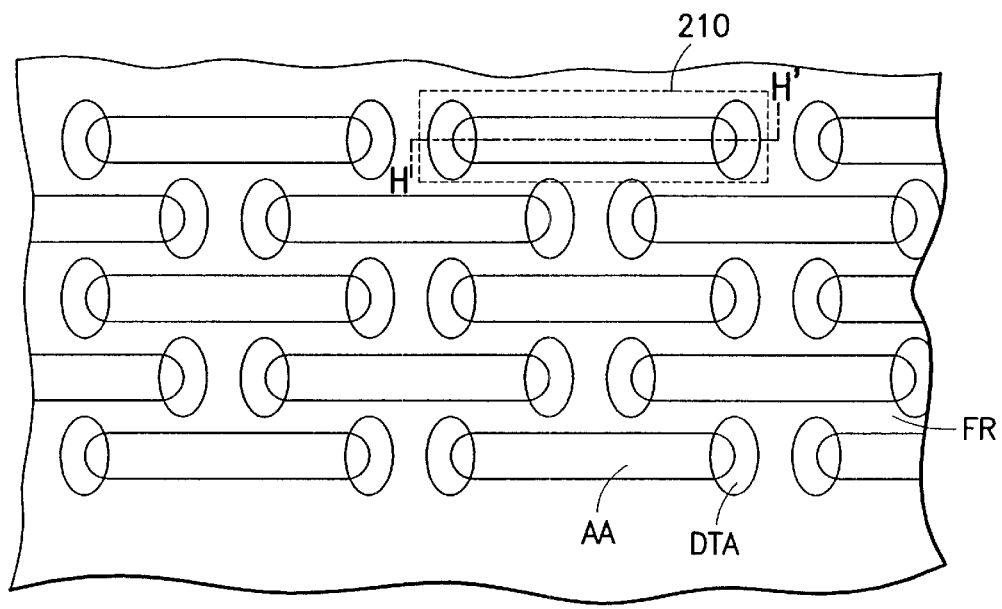
FIG. 2 offers a top plan view illustrating a layout of a conventional array of DRAM cells.
Figure 3:
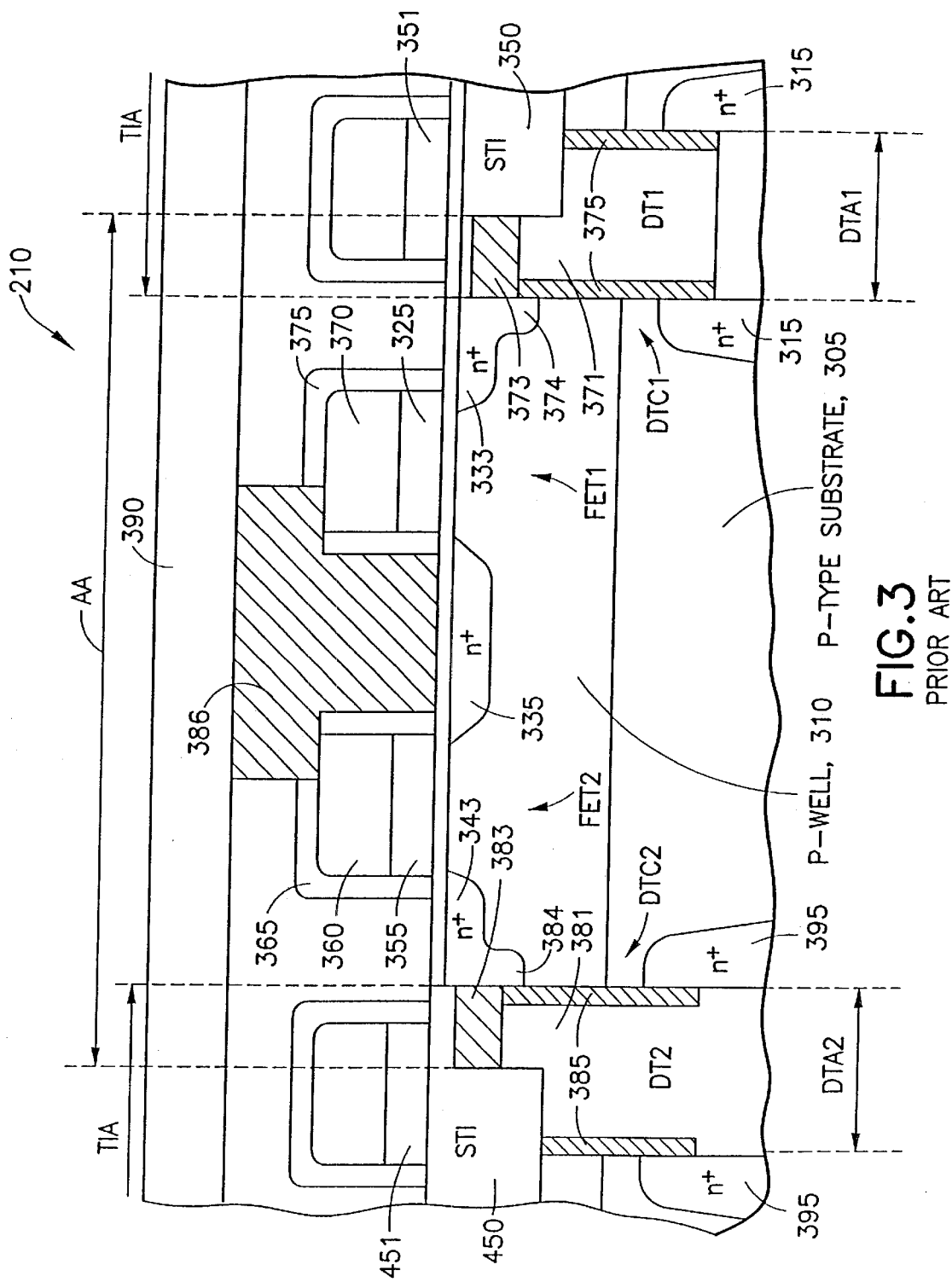
FIG. 3 depicts a cross-sectional view of a DRAM cell taken along a line H—H' of FIG. 2.
Figure 4A:
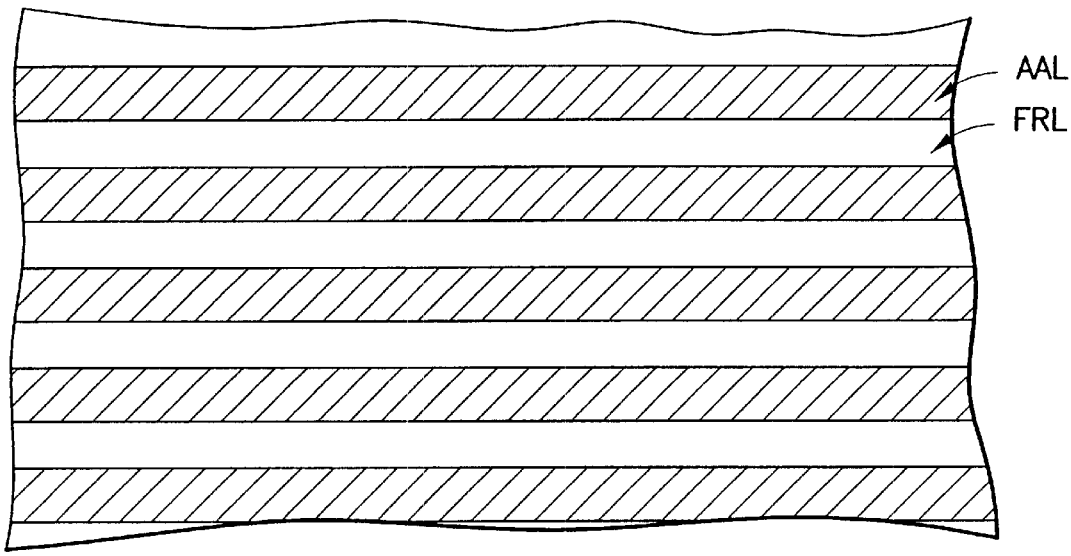
FIGS. 4A to 4B illustrate active area lines and field region lines in an array of DRAM cells in accordance with the present invention.
Figure 4B:
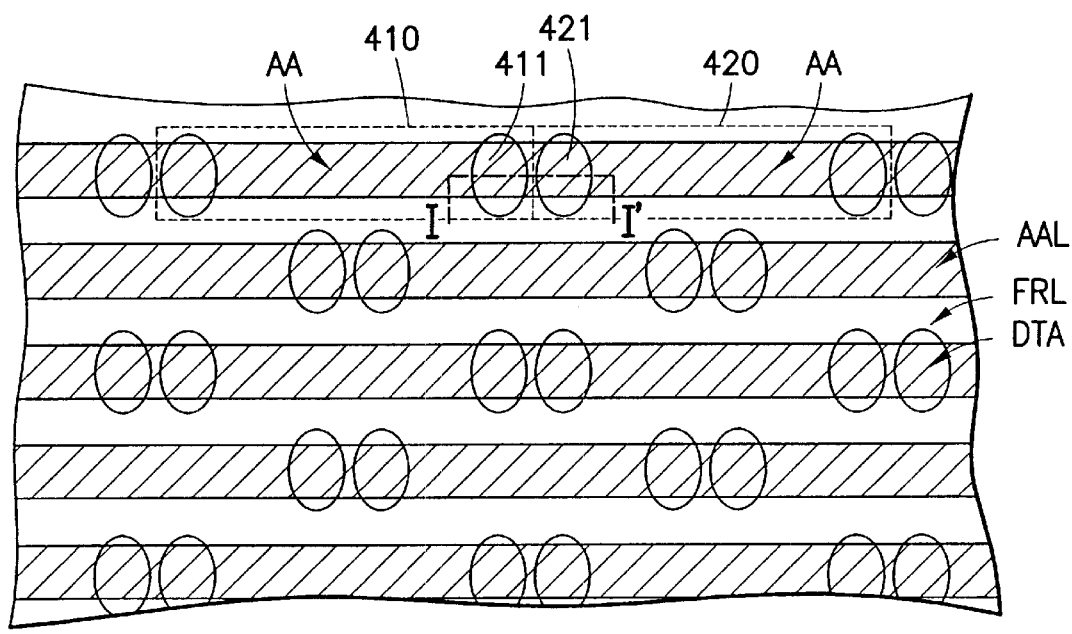

FIGS. 4A to 4B illustrate active area lines and field region lines in an array of dynamic random access memory (DRAM) cells in accordance with the present invention. A method for forming an array of DRAM cells of the present invention is initiated with deep trench capacitors (DTCs) fabrication, followed by line type active areas (AAs) defined after the DTCs fabrication. In detail, first, a substrate is prepared, deep trench capacitors (DTCs) are fabricated in an AAL (FIG. 4A) in a predetermined configuration to thereby define deep trench areas (DTAs) for the DTCs. In accordance with the present invention, each DTC may have a storage node, a collar insulator and a buried strap formed by employing known DTC fabrication techniques. Then line type AAs and line type field regions (FRs) are patterned on the substrate to thereby provide active area lines (AAL) and field region lines (FRLs) as shown in FIG. 4A, wherein two adjacent AALs are separated from each other by a corresponding FRL located therebetween.

Thereafter, a node isolation area (NIA) isolating storage nodes of two adjacent DTCs and a trench isolation area (TIA) for each of the DRAM cells are successively defined. As a result, an array of DRAM cells of the present invention is formed in a line type layout as shown in FIG. 4B. It should be noted that the storage nodes of two adjacent DTCs are isolated from each other by employing a maskless self-aligned node isolation technique, which will be described later.

Referring to FIG. 4A, there are illustrated consecutive horizontal line pairs of an AAL and a FRL. In accordance with the present invention, a plurality of DRAM cells are formed in each AAL, wherein each of the DRAM cells has at least one AA and at least one DTA. For example, referring to FIG. 4B, there are illustrated DRAM cells 410 and 420, wherein each of the DRAM cells 410 and 420 includes one AA and two DTAs.

Figure 8:
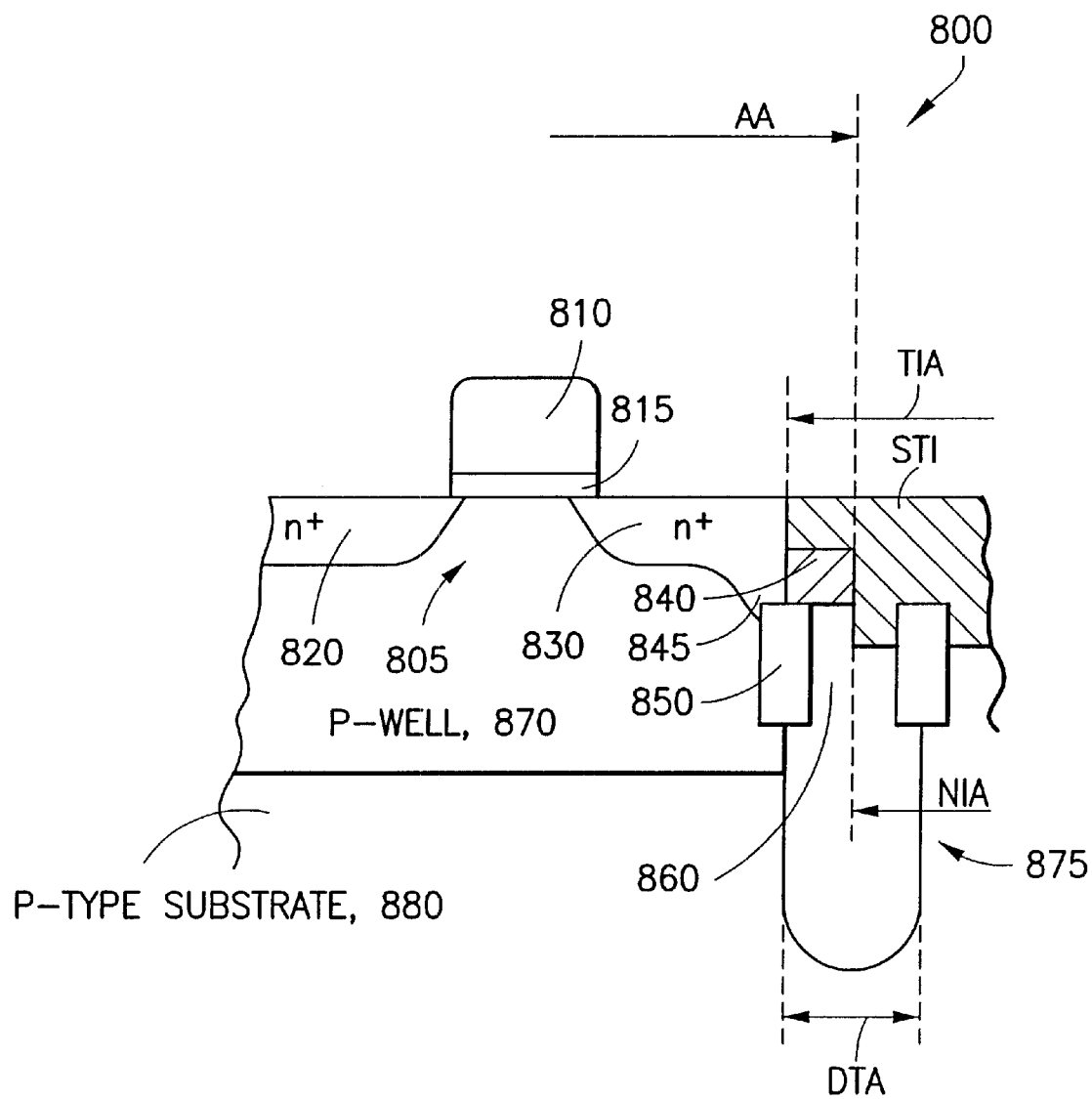
FIG. 8 sets forth a schematic diagram of an exemplary DRAM cell fabricated by using a DRAM cell forming method of the present invention.

The method for forming the array of DRAM cells of the present invention further includes a step for fabricating one or more FETs in a corresponding AA for each DRAM cell to thereby provide an array of DRAM cells. A conductive path may be formed from an electrode of one of the FETs in the corresponding AA for each of the DRAM cells to a buried strap of a corresponding DTC. FIG. 8 sets forth a schematic diagram of an exemplary DRAM cell 800 fabricated by using a DRAM cell forming method of the present invention.

In a preferred embodiment of the present invention, the substrate, e.g., a semiconductor substrate, may include a p-well semiconductor substrate formed on top of a p-type semiconductor substrate as exemplified in FIG. 8. In another preferred embodiment of the present invention, the substrate, may include a n-well semiconductor substrate formed on top of a n-type semiconductor substrate.

From now on, referring to FIGS. 5A to 5F and 6A to 6I, methods for forming an array of DRAM cells by employing self-aligned node isolation techniques in accordance with the preferred embodiments of the present invention will be described.

Figure 5A:
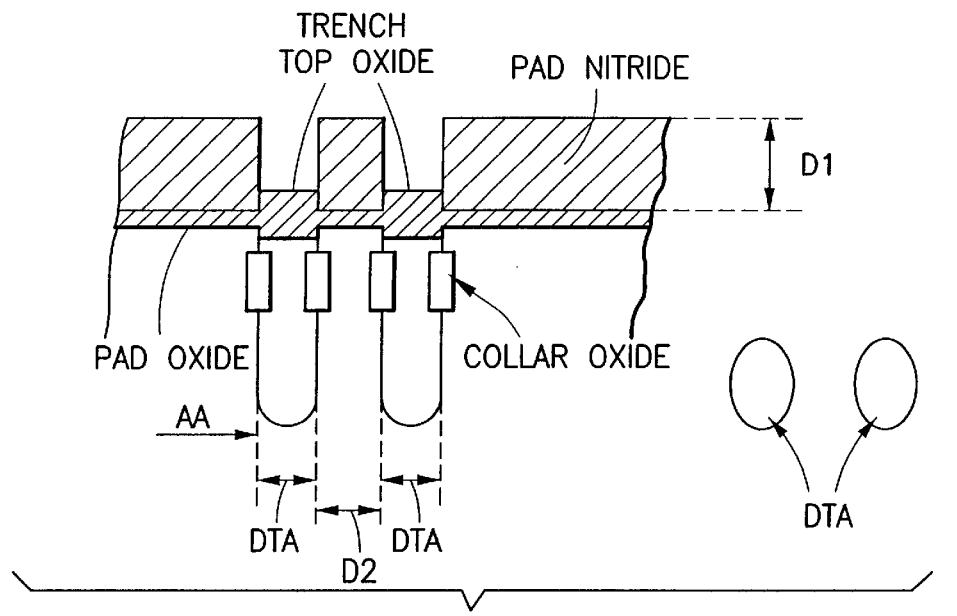
FIGS. 5A to 5F present adjacent node isolation procedures for use in forming an array of DRAM cells in accordance with a preferred embodiment of the present invention.
Figure 5B:
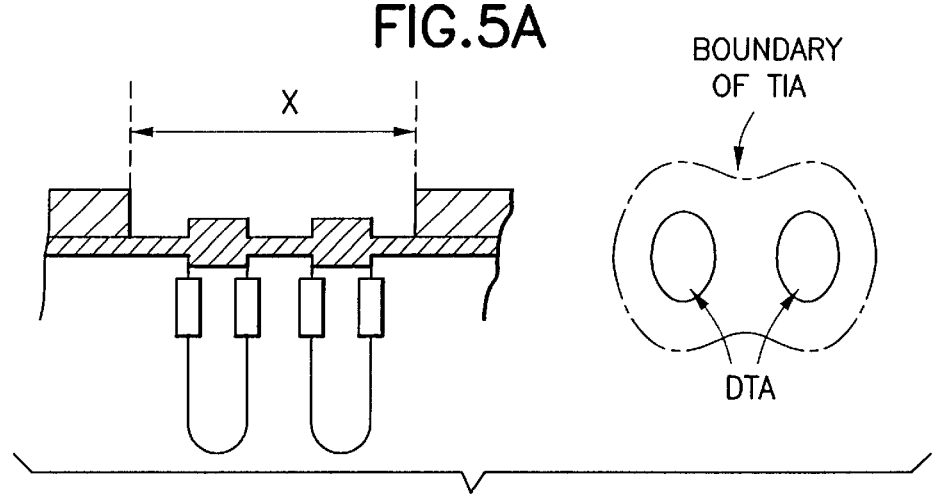

Referring to FIG. 5A, there are shown two adjacent DTCs fabricated in a predetermined configuration by using known DTC fabricating techniques. For example, FIG. 5A may be a cross sectional view of an area having two adjacent DTAs 411 and 421 taken along a line I–I' of FIG. 4B, wherein the DTAs 411 and 421 belong to the DRAM cells 410 and 420, respectively, as shown in FIG. 4B.

In the known DTC fabricating techniques, a substrate including a pad nitride layer deposited on top of a pad oxide layer formed on top of a semiconductor substrate is first patterned in a predetermined configuration. Next, the patterned substrate is etched by using a directional etching technique such as a reactive ion etching (RIE) technique to thereby form two adjacent deep trenches (DTs).

Thereafter, two adjacent DTCs are formed within corresponding two adjacent DTs, respectively, and then trench top oxides are deposited on top of the two adjacent DTCs, respectively, thereby defining two adjacent DTAs therefor as shown in FIG. 5A. By using the method of the present invention, a distance, e.g., referred to as D2 in FIG. 5A, between two adjacent DTCs can be equal to or less than the thickness, e.g., referred to as D1 in FIG. 5A, of the pad nitride layer.

From now on, referring to FIGS. 5B to 5F, adjacent node isolation procedures for use in forming an array of DRAM cells in accordance with a preferred embodiment of the present invention will be described in detail. First, the pad nitride layer located between two adjacent DTCs and a preset portion of the pad nitride layer outside a corresponding DTA are selectively etched, e.g., by using an isotropic etching technique to thereby form a boundary, e.g., X in FIG. 5B, of a TIA.

Figure 5C:
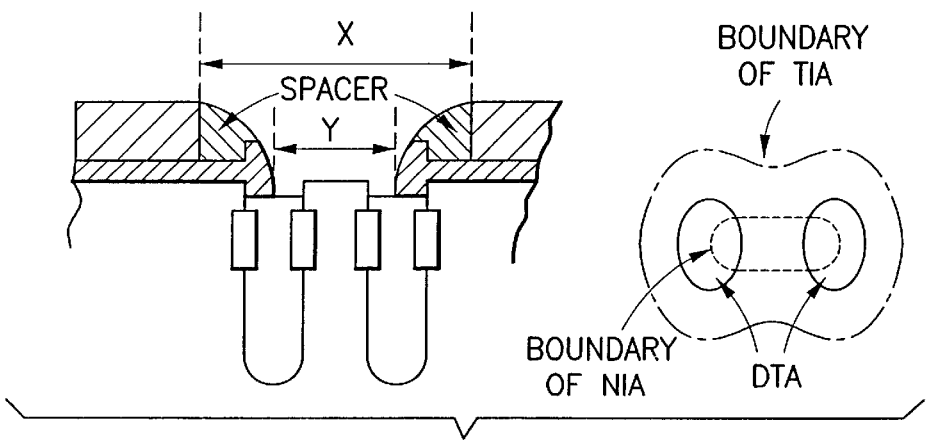

In a subsequent step, an oxide spacer covering a preset portion of the oxide layer within the boundary of the TIA is formed and then a portion of the oxide layer located outside the preset portion of the oxide layer but within the boundary of the TIA is etched away to thereby define a boundary, e.g., Y in FIG. 5C, of a NIA, the preset potion of the oxide layer including both the pad oxide layer outside two adjacent DTAs corresponding to the two adjacent DTCs and a portion of the trench top oxides as shown in FIG. 5C.

Figure 5D:
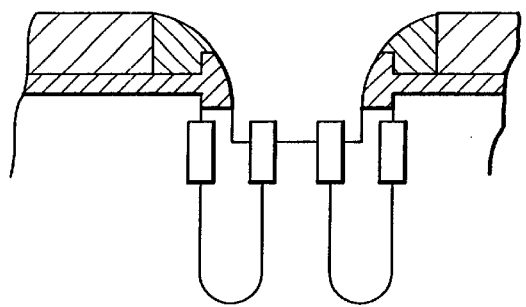

Thereafter, portions of the substrate and a poly-silicon constituting the storage nodes inside the boundary of the NIA are etched after line type AA lithographic patterning to thereby define the NIA as illustrated in FIG. 5D, wherein the NIA represents an area into which an insulating material, e.g., oxide, is to be filled to isolate between the storage node of the corresponding DTC and the storage node of the DTC adjacent to the corresponding DTC.

Figure 5E:
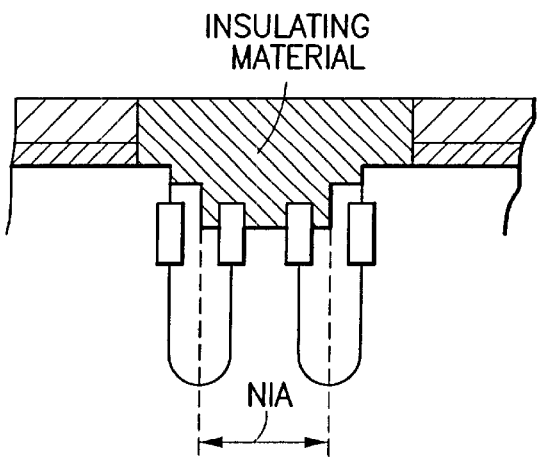

Next, the oxide spacer, the pad oxide and the trench top oxide remaining within the boundary of the TIA can be etched away (or can be kept as a part of filling material); and the areas over the corresponding DTC, its adjacent DTC and the exposed portion of the substrate inside the boundary of the TIA are filled with the insulating material, e.g, oxide as exemplified in FIG. 5E.

Figure 5F:
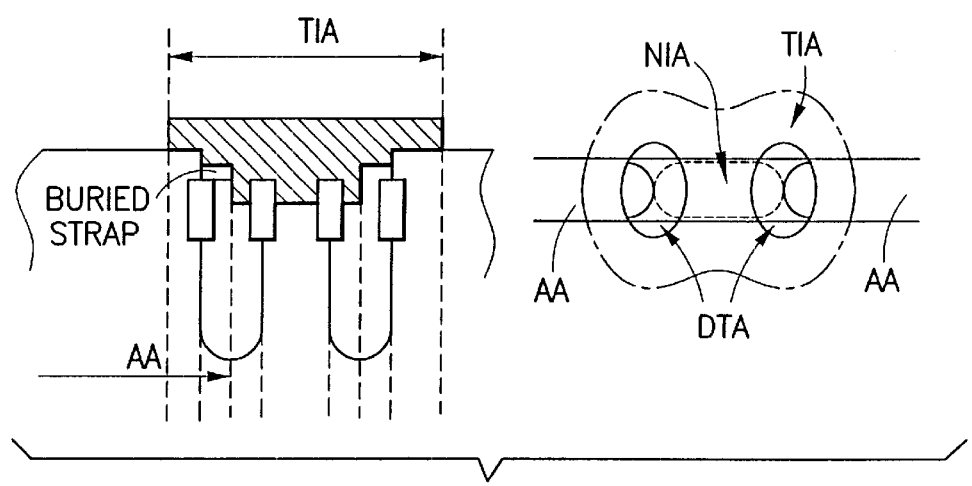

Finally, the remaining portions of the pad nitride and pad oxide layers are etched away to thereby define the TIA for the each of the DRAM cells, e.g., shown in FIG. 5F. It should be noted that the line type AA pattern is not visible in this cross-section. Details of this will be explained later. (FIG. 5F).

The isolation region between two adjacent trenches (NIA) are defined by self-aligned adjacent node isolation techniques. As a result, the NIA need not be defined by AA lithography that requires island type AA pattern as in the conventional technology. Line type AA lithography pattern is done and the support area is defined (not visible in this drawing FIG. 5F) and oxide is filled in the STI area before pad nitride strip of FIG. 5F.

It should be also noted that in accordance with the present invention, as shown in FIG. 5F, a NIA is located within a corresponding TIA; the corresponding AA overlaps with a portion of the corresponding TIA; and a DTA overlaps with a portion of the corresponding NIA and a portion of the corresponding AA. It should also be noted that the TIA outside of DTA needs to be larger than AA area to isolate two adjacent trenches (DTAs). More details will be explained with the next figures.

FIGS. 6A to 6I represent adjacent node isolation procedures for use in forming an array of DRAM cells in accordance with a different cross-section of the present invention.

Figure 6A:
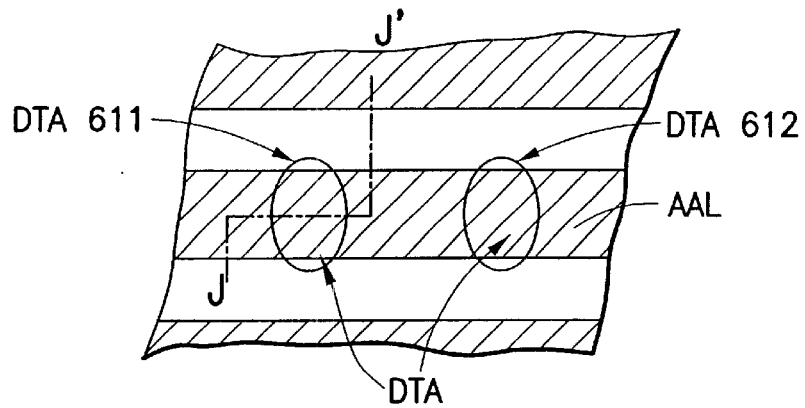
FIGS. 6A to 6I represent node isolation procedures for use in forming an array of DRAM cells in the view of different cross-section with the preferred embodiment of the present invention.

FIGS. 6B to 6I explains details of this invention associated with the cross-section of J–J' of FIG. 6A.

FIGS. 5A to 5F are related to the cross-section of I–I' of FIG. 4B).

Figure 6B:
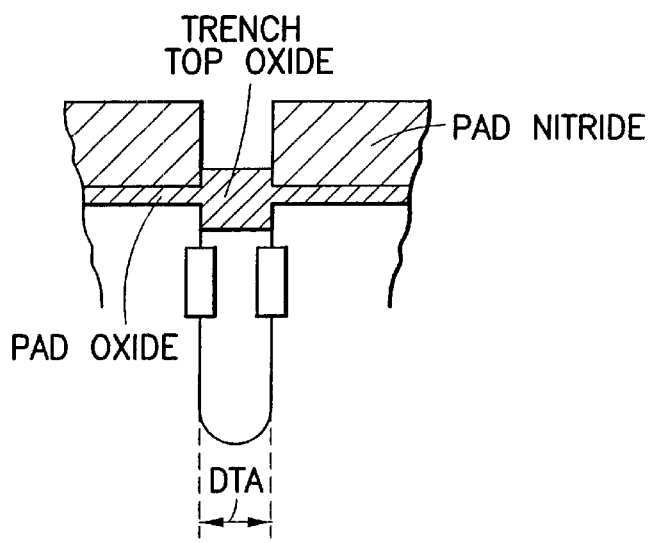
Figure 6C:
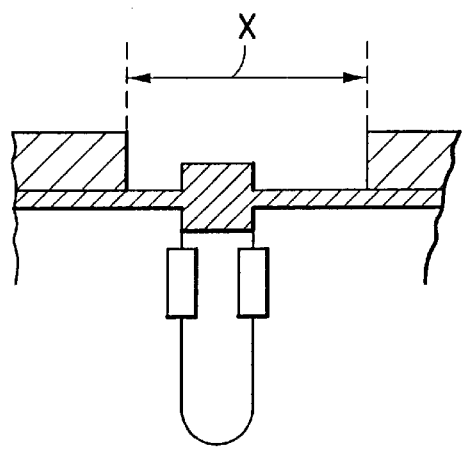
Figure 6D:
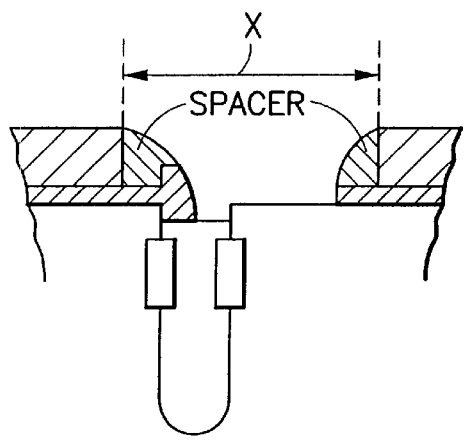

FIG. 6B illustrates a cross sectional view of a DTC fabricated in a predetermined configuration by using known DTC fabricating techniques, whereby a corresponding DTA is formed therein. For example, a DT is formed; a corresponding DTC is formed within the DT; and trench top oxide is deposited on top of the DTC to thereby define a DTA for the DTC as shown in FIG. 6B. FIG. 6B is a cross sectional view of an area having a DTA 611 taken along a line J–J' of FIG. 6A.

From now on, referring to FIGS. 6B to 6I, node isolation procedures for use in forming an array of DRAM cells in accordance with the preferred embodiment of the present invention will be described in detail. First, a preset portion having therein the corresponding DTA of the pad nitride layer is selectively etched to thereby form a boundary, e.g., X in FIG. 6C, of a TIA (same as X in FIG. 5C with different direction).

Figure 6E:
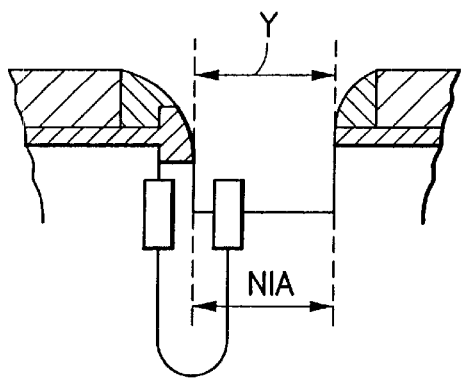

In a subsequent step, an oxide spacer covering a preset portion of the oxide layer within the boundary of the TIA is formed and then a portion of the oxide layer located outside the preset portion of the oxide layer but within the boundary of the TIA is etched away to thereby define a boundary, e.g., Y shown in FIG. 6E, of a NIA, wherein this case, the preset portion of the oxide layer includes both a portion of the pad oxide layer outside the DTA and a portion of the trench top oxide as shown in FIG. 6E.

Thereafter, portions of the substrate and a poly-silicon constituting the storage node of the DTC inside the boundary of the NIA are etched into to thereby define the NIA as illustrated in FIG. 6E, wherein the MA represents an area into which an insulating material as an isolation insulator, e.g., oxide, is to be filled to isolate the storage node of the DTC and a storage node (not shown) of a DTC (not shown) adjacent to the DTC.

Figure 6F:
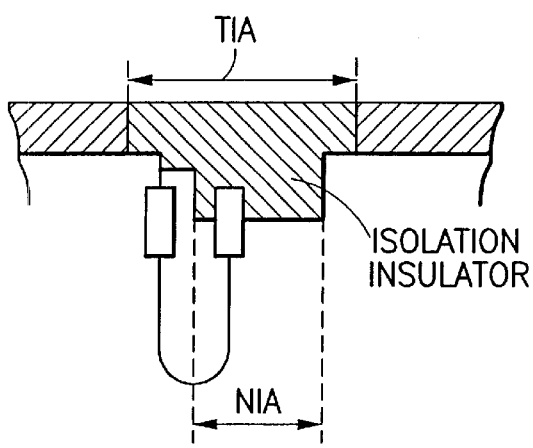

Next, the oxide spacer, pad oxide and the trench top oxide remaining within the boundary of the TIA are etched away; the areas inside the boundary of the TIA are filled with an isolation insulator, shown in FIG. 6F.

Figure 6G:
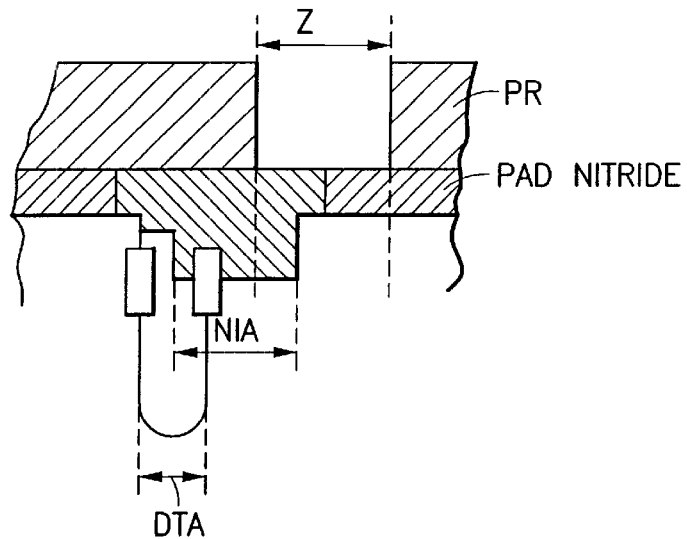
Figure 6H:
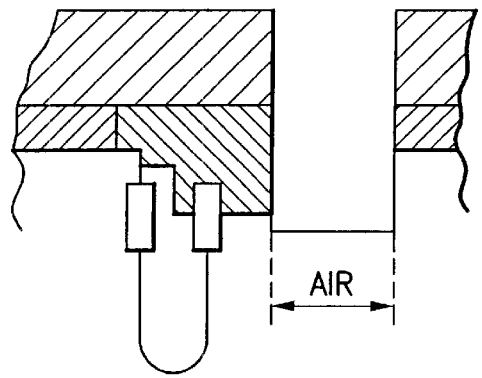

In a next step, as represented in FIG. 6G, a photoresist is patterned by using a known photolithography scheme to thereby form a boundary, e.g., Z shown in FIG. 6G, of an additional isolation region (AIR) to extend the NIA. It should be noted that in this case, the AIR should be partially overlapped with the NIA as shown in FIG. 6G. Thereafter, the pad nitride layer, the insulating material together with the pad oxide layer and the substrate within the AIR are successively etched to thereby define the AIR as a shallow trench isolation area as exemplified in FIG. 6H.

It should be noted that a line type AA pattern is used instead of a island type pattern, since NIA is defined with the invention.

Figure 6I:
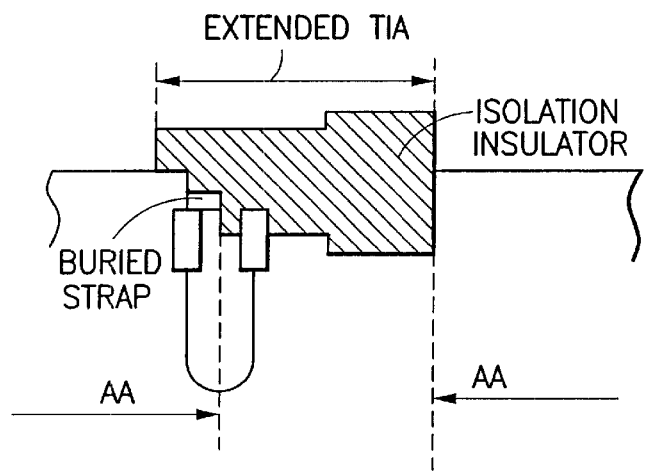

Finally, the STI (shallow trench isolation) area is filled with an isolation insulator, e.g., oxide, and in turn remaining portions of the pad nitride and oxide layers are stripped to thereby define an extended TIA and AAs as illustrated in FIG. 6I.

FIGS. 7A to 7G reveal adjacent node isolation procedures for use in forming an array of DRAM cells in accordance with yet another preferred embodiment of the present invention. In this case, AAs are defined first and then DTCs are fabricated, thereby providing thermal budget advantages in fabricating an array of DRAM cells as mentioned earlier.

In detail, a pad oxide layer and a pad nitride layer are formed in a predetermined configuration on a substrate by using a known technique. Line type AA lithography pattern (FIG. 7A) is formed.

It should be noted that pad nitride thickness variation (comes from poly CMP process during capacitor formation) can be eliminated.

Figure 7A:
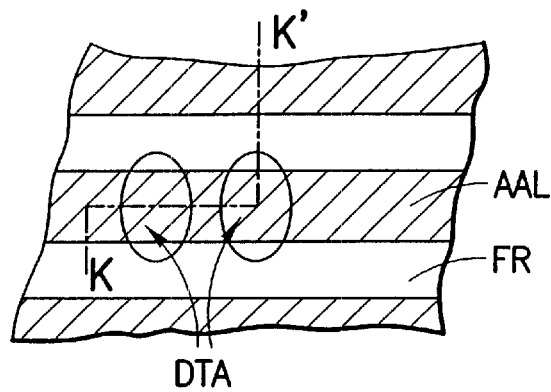
FIGS. 7A to 7G reveal adjacent node isolation procedures for use in forming an array of DRAM cells in accordance with yet another preferred embodiment of the present invention.
Figure 7B:
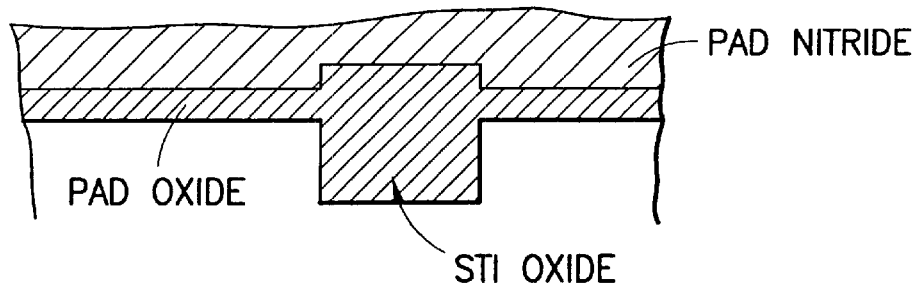

Well known shallow trench isolation technology can be used to fill FR region with oxide as shown in FIG. 7B, and sintered pad nitride is deposited after STI fill as shown in FIG. 7B.

Figure 7C:
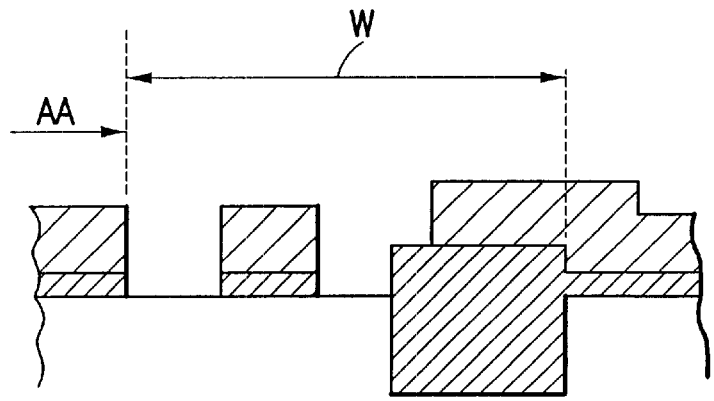

Next, the pad nitride layer is patterned in a predetermined configuration by using a conventional patterning technique to thereby form two openings as illustrated in FIG. 7C to be used in a subsequent DTC fabricating step. For example, FIG. 7C may be a cross sectional view of an area having two adjacent DTAs taken along a line K–K' of FIG. 7A. It should be noted that in this case, a portion of the STI oxide exists inside one of the two openings as shown in FIG. 7C. It should be noted that W in FIG. 7C represents a boundary of an extended TIA described later. It should be noted that a combination of BSG/2nd pad nitride can be used to form deep trenches. The BSG can be used as mask material during DT etch. In this example, nitride is used for clear explanation of the invention.

Figure 7D:
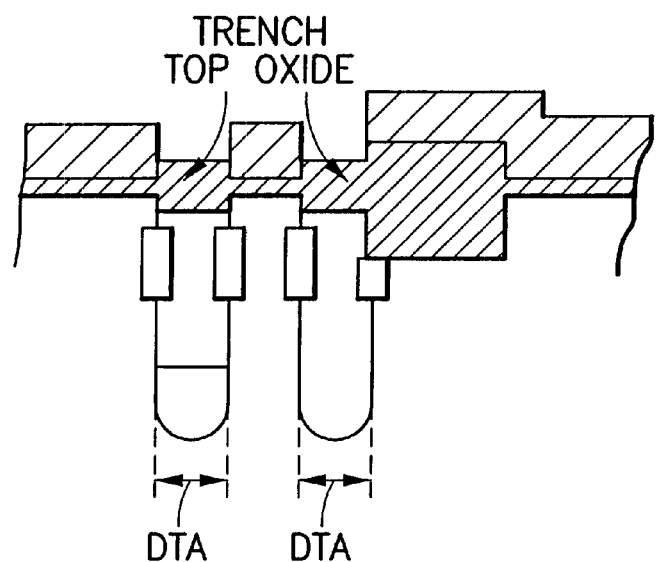

In a subsequent step, two adjacent DTCs are formed within corresponding two DTs, respectively, and then trench top oxides are deposited on top of the two DTCs, respectively, thereby defining two adjacent DTAs as shown in FIG. 7D.

Figure 7E:
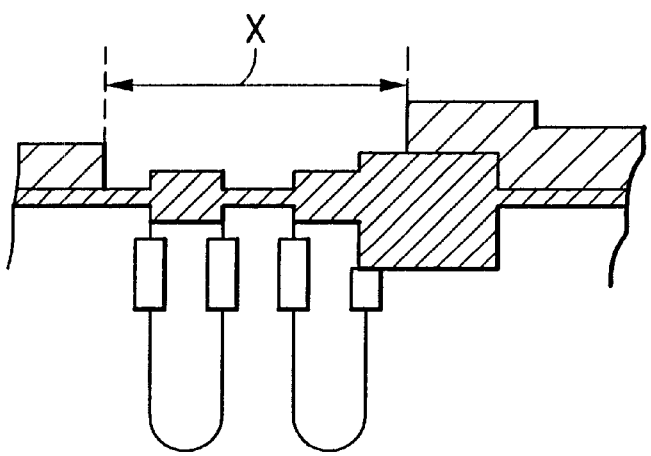

Next, the pad nitride layer located between two adjacent DTCs and a preset portion of the pad nitride layer outside the two corresponding DTAs are selectively etched to thereby form a boundary, e.g., X in FIG. 7E, of a TIA, wherein a portion of an area corresponding the STI oxide should be existed within the boundary of the TIA.

Figure 7F:
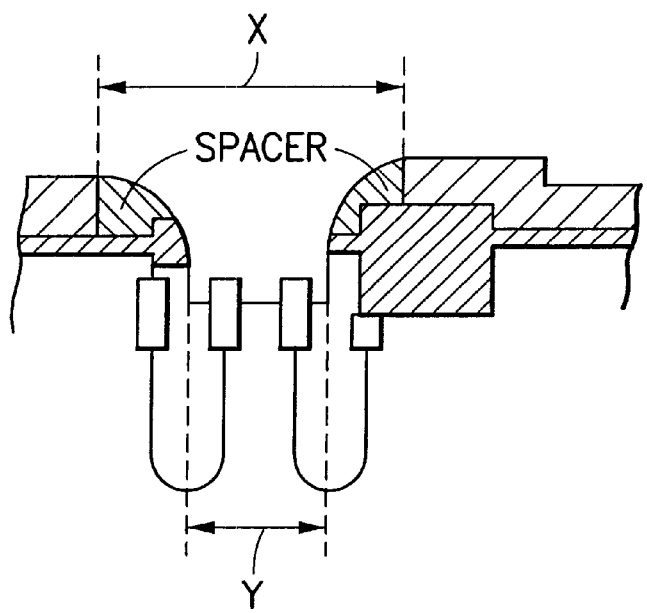

In a subsequent step, an oxide spacer covering a preset portion of the oxide layer within the boundary of the TIA is formed and then a portion of the oxide layer located outside the preset portion of the oxide layer but within the boundary of the TIA is etched away to thereby define a boundary, e.g., Y in FIG. 7F, of a NIA; and then portions of the substrate and a poly-silicon constituting the storage nodes inside the boundary of the NIA are etched into to thereby define the NIA as illustrated in FIG. 7F.

It should be noted that in this case, the preset potion of the oxide layer within the boundary of the TIA includes the trench top oxides, a portion of the pad oxide layer outside the two corresponding DTAs and a portion of STI oxide; and the NIA represents an area into which an insulating material, e.g., oxide, is to be filled to isolate the storage node of the corresponding DTC and the storage node of the DTC adjacent to the corresponding DTC.

Figure 7G:
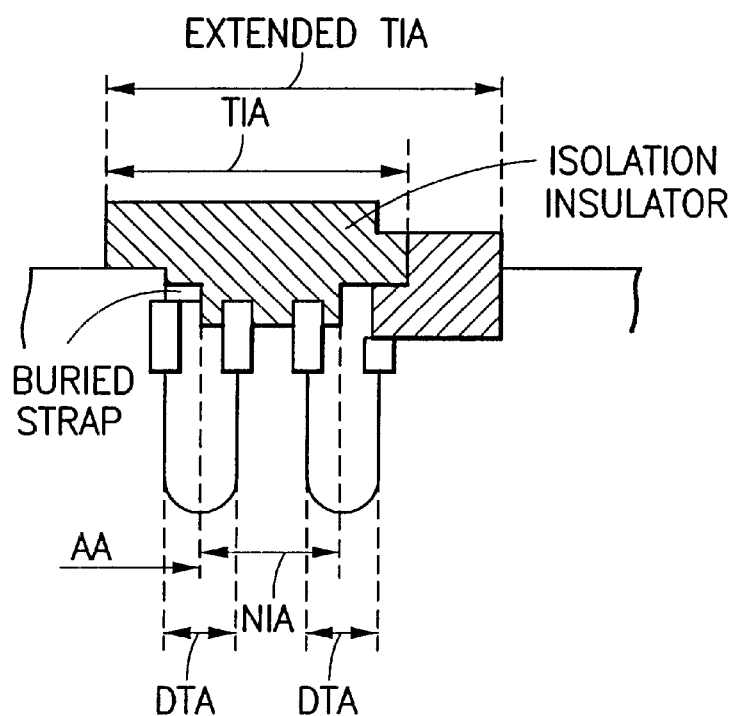

Next, the oxide spacer, the pad oxide, the trench top oxide and the trench pad oxide remaining within the boundary of the TIA can be etched away (or can be kept as a part of insulating material); and the areas over the corresponding DTC and its adjacent DTC and the exposed portion of the substrate inside the boundary of the TIA are filled with an insulating material, e.g, oxide; and finally, the remaining portions of the pad nitride and pad oxide layers are etched away to thereby define an extended TIA, e.g., shown in FIG. 7G, for each of the DRAM cells.

Further, in accordance with the present invention, one or more FETs are fabricated after defining the TIA, wherein a conductive path is formed from an electrode of one of the FETs in a corresponding AA for each of the DRAM cells to the buried strap of a corresponding DTC. Referring back to FIG. 8, the DRAM cell 800 comprises a DTC 875 and a FET 805 formed in a p-type substrate 880 doped with a P-well 870 formed therein.

The DTC 875 includes a collar oxide 850, a storage node 860 and a buried strap 840. The FET 805 includes N$^+$ source/drain regions 820 and 830, a poly-silicon gate 810 insulatively spaced from the channel between N$^+$ source/drain regions 820 and 830 by a gate oxide 815. A diffusion region 845 is formed as a conductive path to electrically connect the storage node 860 through a buried strap 840 to the N$^+$ source/drain region 830.

In accordance with the present invention, since the AAs are patterned or formed before DTCs are formed, the so-called thermal budget problem can be solved or relaxed. For example, the thermal cycle during AA formation, e.g., a STI, and the so-called tetra ethyl ortho silicate (TEOS) wet anneal does not affect the dopant diffusion through the buried strap in a DRAM cell.

Further, since the AAs may be patterned as a line type, the AAs can be patterned with a great ease than the conventional AA patterning technique. In addition, the overlay margin between each AA and a corresponding DTA in a DRAM cell can be improved by employing a maskless self-aligned adjacent node isolation technique.

While the present invention has been described with respect to the particular embodiments, it will be apparent to those skilled in the art that various modifications and changes may be made without departing from the spirit and scope of the invention as defined in the following claims.

What is claimed is:

1. A method for forming an array of dynamic random access memory (DRAM) cells, comprising the steps of:

defining an active area line (defined AAL) and an adjacent field region line (defined FRL) on a substrate;

fabricating two adjacent deep trench capacitors (DTCs) in said substrate so that said DTCs are aligned along said defined AAL;

forming a node isolation area (NIA) over and between said DTCs; and forming an active area (AA) in a portion of said substrate within said defined AAL and not protected by said NIA.

2. The method according to claim 1 further comprising forming a shallow trench isolation (STI) prior to said fabricating two adjacent DTCs, wherein said STI is formed in said defined FRL.

3. The method according to claim 1 further comprising forming a shallow trench isolation (STI) after said forming said NIA, wherein said STI is formed in said defined FRL.

4. The method according to claim 1 wherein said fabricating said DTCs further comprises:

forming an oxide layer over said substrate;

forming a mask layer over said oxide layer;

patterning said mask layer to define a first mask opening and a second mask opening;

anisotropically etching through said oxide layer and into said substrate using said first and second mask openings to form a first deep trench (DT1) and a second deep trench (DT2) and leaving a patterned oxide layer;

forming a first deep trench capacitor (DTC1) and a second deep trench capacitor (DTC2) within said DT1 and DT2, respectively; and forming a first trench top oxide (TTO1) and a second trench top oxide (TTO2) at the top of said DTC1 and DTC2, respectively, so that a continuous oxide layer is formed comprising said TTO1, said TTO2 and said patterned oxide layer.

5. The method according to claim 4 wherein said forming said NIA further comprises:

isotropically etching a merged mask opening in said mask material so that said merged mask opening is substantially centered between said DTC1 and DTC2;

forming an oxide spacer on sidewalls of said merged mask opening, wherein said oxide spacer defines a node isolation boundary, is contiguous with said continuous oxide layer and overlies an outer portion of said DTC1 and an outer portion of said DTC2 wherein said node isolation boundary defines exposed inner portions of said DTC1, said DTC2 and said substrate;

anisotropically etching said exposed inner portions of said DTC1, said DTC2 and said substrate to form a recess in said DTC1, said DTC2 and said substrate within said node isolation boundary; and filling said recess with an oxide to form said NIA.

6. The method according to claim 4 wherein said mask layer has a mask thickness and wherein boundaries of said DT1 and DT2 are separated by a minimum DT spacing less than or equal to about said mask thickness.

7. The method according to claim 4 wherein said mask layer comprises a nitride.

8. The method according to claim 5 wherein said AA has an AA width and said merged mask opening has a minimum width larger than said AA width.

9. A method for forming an array of dynamic random access memory (DRAM) cells, comprising the steps of:

defining an active area line (defined AAL) and an adjacent field region line (defined FRL) on a substrate;

forming a shallow trench isolation (STI), wherein said STI is formed in said defined FRL;

fabricating two adjacent deep trench capacitors (DTCs) in said substrate so that said DTCs are aligned along said defined AAL;

forming a node isolation area (NIA) over and between said DTCs; and forming an active area (AA) in a portion of said substrate within said defined AAL and not protected by said NIA.

10. The method according to claim 9 wherein said fabricating said DTCs further comprises:

forming an oxide layer over said substrate;

forming a mask layer over said oxide layer;

patterning said mask layer to define a first mask opening and a second mask opening;

anisotropically etching through said oxide layer and into said substrate using said first and second mask openings to form a first deep trench (DT1) and a second deep trench (DT2) and leaving a patterned oxide layer;

forming a first deep trench capacitor (DTC1) and a second deep trench capacitor (DTC2) within said DT1 and DT2, respectively; and forming a first trench top oxide (TTO1) and a second trench top oxide (TTO2) at the top of said DTC1 and DTC2, respectively, so that a continuous oxide layer is formed comprising said TTO1, said TTO2 and said patterned oxide layer.

11. The method according to claim 9 wherein said forming said NIA further comprises:

isotropically etching a merged mask opening in said mask material so that said merged mask opening is substantially centered between said DTC1 and DTC2;

forming an oxide spacer on sidewalls of said merged mask opening, wherein said oxide spacer defines a node isolation boundary, is contiguous with said continuous oxide layer and overlies an outer portion of said DTC1 and an outer portion of said DTC2 wherein said node isolation boundary defines exposed inner portions of said DTC, said DTC2 and said substrate;

anisotropically etching said exposed inner portions of said DTC1, said DTC2 and said substrate to form a recess in said DTC1, said DTC2 and said substrate within said node isolation boundary; and filling said recess with an oxide to form said NIA.

12. The method according to claim 10 wherein said mask layer has a mask thickness and wherein boundaries of said DT1 and DT2 are separated by a minimum DT spacing less than or equal to about said mask thickness.

13. The method according to claim 10 wherein said mask layer comprises a nitride.

14. The method according to claim 11 wherein said AA has an AA width and said merged mask opening has a minimum width larger than said AA width.

* * * * *